(12) United States Patent
Hamilton

(10) Patent No.: US 6,187,091 B1
(45) Date of Patent: Feb. 13, 2001

(54) APPARATUS AND PROCESS FOR GROWING SILICON EPITAXIAL LAYER

(75) Inventor: Todd A. Hamilton, Portland, OR (US)

(73) Assignee: SEH America, Inc., Vancouver, WA (US)

(*) Notice: Under 35 U.S.C. 154(b), the term of this patent shall be extended for 0 days.

(21) Appl. No.: 09/394,362

(22) Filed: Sep. 10, 1999

Related U.S. Application Data

(62) Division of application No. 08/784,322, filed on Jan. 16, 1997, now Pat. No. 5,993,555.

(51) Int. Cl.[7] ................................................ C23C 16/00
(52) U.S. Cl. .................................... 117/89; 117/93
(58) Field of Search .......................... 117/89, 93

(56) References Cited

U.S. PATENT DOCUMENTS 5,421,288   6/1995   Ohta et al. .
5,487,358   1/1996   Ohta et al. .

FOREIGN PATENT DOCUMENTS 58-156593   9/1983   (JP) .

*Primary Examiner*—Richard Bueker
(74) *Attorney, Agent, or Firm*—Alston & Bird LLP

(57) ABSTRACT

An apparatus and a process for growing a silicon epitaxial layer on a main surface of a silicon substrate wafer are disclosed. The apparatus and process provide a reactor and a gas feeder system. The gas feeder system utilizes an auxiliary dopant supply mass flow control (MFC) to provide an auxiliary dopant only into a central injector that effects epitaxial deposition on the center of the wafer for autodoping correction. An auxiliary bellows metering valve is provided between the auxiliary MFC and the center injector to absorb pressure variations in the central flow line to prevent the pressure variations from reaching the auxiliary MFC. This results in a stable and consistent dopant concentration and resistivity profile.

8 Claims, 7 Drawing Sheets

APPARATUS AND PROCESS FOR GROWING SILICON EPITAXIAL LAYER

RELATED APPLICATION

The present application is a divisional of U.S. patent application No. 08/784,322, filed Jan. 16, 1997, entitled Apparatus and Process for Growing Silicon Epitaxial Layer that has now issued as U.S. Pat. No. 5,993,555.

BACKGROUND OF THE INVENTION

1. Area of the Art

The invention relates generally to an apparatus and a process for growing a silicon epitaxial layer, and specifically to an apparatus and a process for growing a silicon epitaxial layer which has an epitaxial surface with a consistent resistivity profile.

2. Description of the Prior Art

In an epitaxial reactor, a phenomenon known as autodoping occurs on substrate silicon wafers which do not have a backside film barrier. Autodoping occurs when the dopant used in the substrate wafer (such as boron for P-type, or phosphorus or antimony for N-type) outgasses from the backside of the wafer, gets caught in the flow of the gases used in the epitaxial reactor, and is redeposited on the front side of the wafer toward the peripheral edge of the wafer. The result of this deposition of dopant causes the resistivity profile of the epitaxial surface to significantly vary radially from the edge to the center of the wafer. The center of the wafer will theoretically have the desired resistivity, then the resistivity will decease following the wafer radially outwardly from the center when boron is used, and will increase following the wafer radially outwardly from the center when antimony or phosphorus is used.

Since autodoping is a very undesirable phenomenon and the resulting variation in resistivity is unacceptable, present technology calls for deposition of a film barrier of a silicon nitride, silicon carbide, or more commonly silicon dioxide, on the backside of the wafer. The film barrier on the backside of the wafer prevents the dopant used in the substrate from outgassing and becoming airborne in the reactor chamber. Often, however, the backside film barrier has to be removed after epitaxial deposition. The removal of the backside film barrier after epitaxial deposition increases the cost of the wafer because of the added steps of both deposition and removal of the film.

Several apparatuses and methods have been used to control the effects of autodoping without the use of a backside film barrier. For example, U.S. Pat. Nos. 5,421,288 and 5,487,358 disclose an apparatus and a process for growing a silicon epitaxial layer. Both patents discuss controlling the effects of autodoping without the use of a backside film barrier. According to the patents, the thickness and the resistivity profile of the epitaxial layer are controlled through the use of independent mass flow controllers (MFC) on center injectors and peripheral injectors.

Another example of epitaxial reactors is the one manufactured by Applied Materials Technology Corporation (AMT). This type of epitaxial reactor uses a mass flow controller (MFC) to control an auxiliary dopant supply that is deposited only into the injectors that effect epitaxial deposition on the center of the wafer. The auxiliary dopant added is such that it matches the autodoping dopant on the peripheral edges of the wafer, theoretically giving a smooth resistivity profile.

The limitation of the MFC design relates to the sensitivity of the MFC. For example, when the AMT epitaxial reactor is used, the reliability of the auxiliary dopant is dependent upon a consistent and well-controlled gas pressure on both sides of the MFC. During normal operation of the reactor, there are some pressure fluctuations in the gas flow line leading to the injector. This results in varying auxiliary dopant concentrations being emitted, and thus an unstable resistivity profile in the epitaxial layer of the wafer.

Therefore, a need exists to provide an apparatus and a process for growing silicon epitaxial layer having a consistent dopant concentration and resistivity profile.

SUMMARY OF THE INVENTION

It is an object of the present invention to provide an apparatus and a process for solving the above-mentioned problems, and particularly to provide an apparatus and a process for growing a silicon epitaxial layer having a consistent dopant concentration and a resistivity profile.

These and other objects are achieved in an epitaxial reactor system having a horizontal chamber containing a susceptor mounted within the chamber for holding the silicon substrate wafer in a horizontal position on the top surface of the susceptor so that the main surface of the silicon substrate wafer is facing upward. The system comprises a series of injectors arranged transversely to the horizontal axis of the chamber. The injectors comprise a central injector passing a flow of a reactive gas past a central part of the chamber and peripheral injectors passing flows of the reactive gas past a peripheral part of the chamber. The reactive gas consists of a silicon source, a dopant and hydrogen. The system also comprises a gas feeder system connected to the central injector and the peripheral injectors and feeding the reactive gas to the injectors; an auxiliary dopant feeder system connected to the central injector passing flows of dopant gas past the central part of the chamber, wherein both the gas feeder system and the auxiliary dopant feeder system are connected to the central injector through a central flow line; and means connected between the auxiliary dopant feeder system and the central injector for absorbing pressure variations in the central flow line to prevent the pressure variations from reaching the auxiliary dopant feeder system.

Such an arrangement has been found to provide a number of advantages. As explained in greater detail below, it has been found that by providing means for absorbing the pressure variations in the central flow line between the auxiliary dopant mass flow controller (MFC) and the central injector, the pressure variations therein may be prevented from reaching the auxiliary dopant MFC, and therefore a consistent resistivity profile can be achieved on the epitaxial layer without a protective seal on the back surface of the wafer.

The system is well suited for use in connection with an epitaxial reactor system, and particularly in an epitaxial reactor system using an auxiliary dopant mass flow controller to control the auxiliary dopant supply that is deposited only into the injectors that effect epitaxial deposition on the center of the wafer. In this use of the epitaxial reactor system, wherein an epitaxial layer is grown on a main surface of a silicon wafer which is held in a horizontal type of chamber, parallel flows of reactive gas from a plurality of positions which are arranged in a width direction of the flows are concurrently fed into the chamber so that an epitaxial layer is formed in the vicinity of the center of the silicon wafer and in the vicinity of the peripheral portions of the wafer. The reactive gas comprises a silicon source, a dopant and hydrogen. The concentration of the dopant in the reactive gas which is fed from a center side in the width direction of the flows is adjusted so that the resistivity of the epitaxial layer formed in the vicinity of the center of the silicon wafer is approximately the same as that of the vicinity of the peripheral portions thereof. In a preferred embodiment, the adjusting step comprises a first adjusting step to provide a predetermined amount of an auxiliary dopant to pass into the reactive gas which is fed from the center side, and a second adjusting step to reduce the concentration variation of the auxiliary dopant in the reactive gas. Preferably, the second adjusting step is carried out by a bellows metering valve.

The invention is defined in its fullest scope in the appended claims and is described below in its preferred embodiments.

DESCRIPTION OF THE FIGURES

The above-mentioned and other features of this invention and the manner of obtaining them will become more apparent, and will be best understood by reference to the following description, taken in conjunction with the accompanying drawings. These drawings depict only a typical embodiment of the invention and do not therefore limit its scope. They serve to add specificity and detail. In the drawings.

DETAILED DESCRIPTION OF THE INVENTION

The arrangement of a conventional apparatus and method for growing a silicon epitaxial layer and the preferred embodiments of the apparatus and methods according to the present invention will be described in turn hereinafter, with reference to the drawings.

Figure 1:
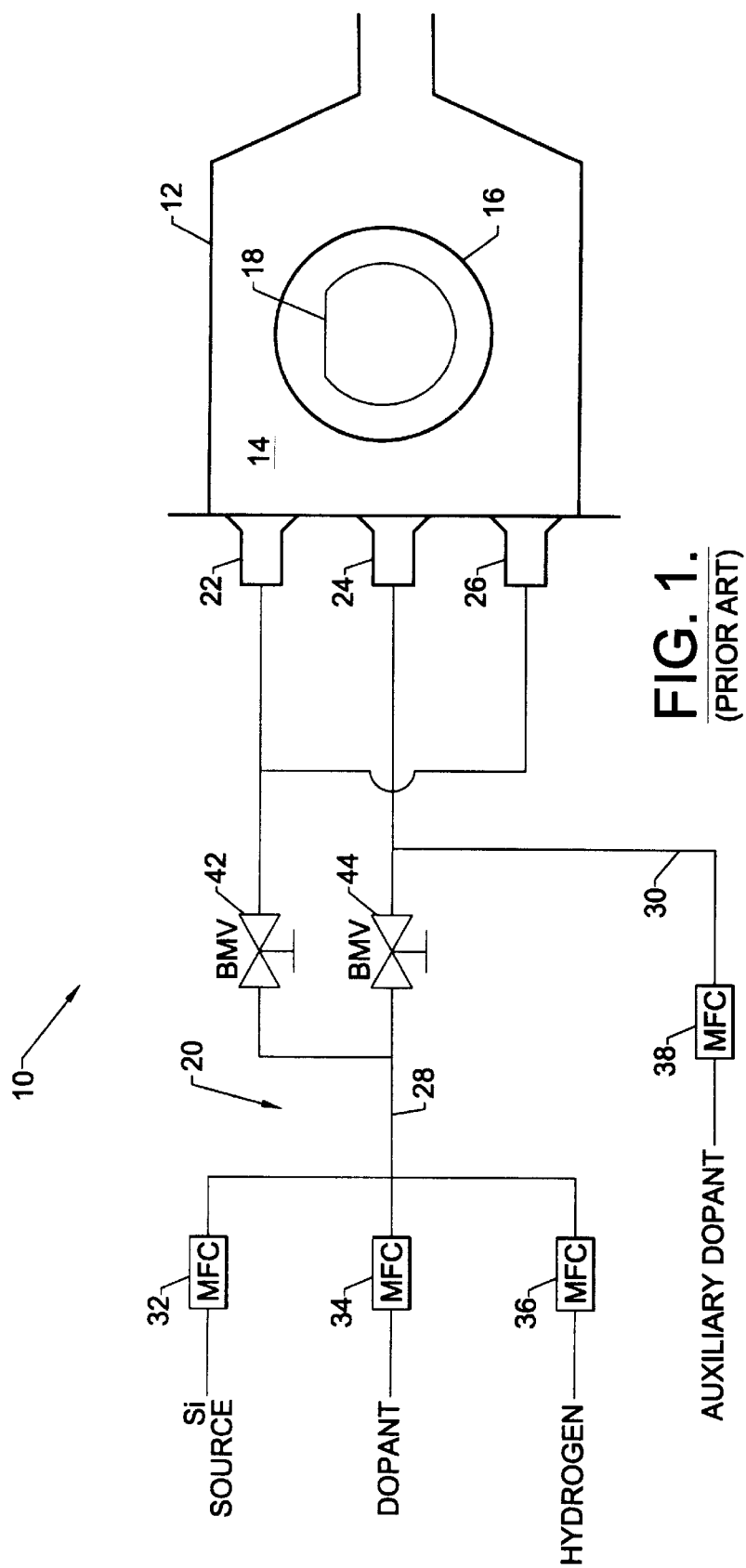
FIG. 1 is an illustrative diagram showing an arrangement of a prior art apparatus and process for growing a silicon epitaxial layer.

FIG. 1 is a schematic diagram and longitudinal side sectional view of a conventional single-wafer-processing apparatus 10 for growing a gas phase silicon epitaxial wafer. The apparatus 10 typically comprises a reactor 12, a gas feeder system 20, heaters for heating silicon epitaxial wafers (not shown), a wafer transfer system (not shown), a control system (not shown) and a vacuum system (not shown).

The reactor 12 is made of quartz and has the form of an elongate housing defining a reaction chamber 14, and has a disc-shaped susceptor 16 mounted therein. The susceptor 16 holds a silicon substrate wafer 18 (a silicon epitaxial wafer has the same label as the silicon substrate wafer for convenience of the description hereinafter) on the top surface thereof and is rotated in a horizontal plane during epitaxy. The susceptor 16 has a shaft (not shown) rigidly joined thereto and extending outside the reactor 12. A motor (not shown) rotates the susceptor shaft. Preferably, the susceptor 16 is of the single wafer-processing type.

The gas feeder system 20 is fluidly connected to the reaction chamber 14 of the reactor 12 and comprises three injectors 22, 24 and 26 arranged transversely to the longitudinal axis of the reactor 12. The three injectors 22, 24 and 26 have a common gas feed line 28 which is in turn connected to mass flow controllers (MFCs) for a reactive gas. The reactive gas consists of the silicon source (e.g., monosilane, dichlorosilane, trichlorosilane or tetrachlorosilane), a small volume of the dopant and hydrogen ($H_2$) for diluting the silicon source and the dopant.

The injectors 22, 24 and 26 concurrently feed flows of the reactive gas of an equal silicon source concentration and an equal dopant concentration to the main surface of the wafer 18 on the susceptor 16. The MFCs 32, 34 and 36 control the silicon source concentration and the dopant concentration of the reactive gas fed to the three injectors. The gas feed line 28 is further connected to two bellows metering valves 42 and 44 respectively before being connected to the injectors 22 and 26, and 24 respectively.

In addition, an auxiliary dopant supply line 30 is provided with an auxiliary dopant, deposited only into the central injector 24 that effects epitaxial deposition on the center of the wafer 18. An auxiliary MFC 38 is also provided to control the amount of the auxiliary dopant such that it will match the autodoping dopant on the peripheral edges of the wafer for giving a smooth resistivity profile.

However, the conventional arrangement of FIG. 1 has serious limitations due to the sensitivity of the auxiliary MFC 38. The reliability of the auxiliary dopant is highly dependent upon a consistent and well-controlled gas pressure on both sides of the auxiliary MFC 38. During normal operation of the reactor 12, there are often pressure fluctuations in the gas flow line leading to the injectors. This results in varying auxiliary dopant concentrations being emitted, and thus an unstable resistivity profile in the epitaxial layer of the wafer.

Figure 2:
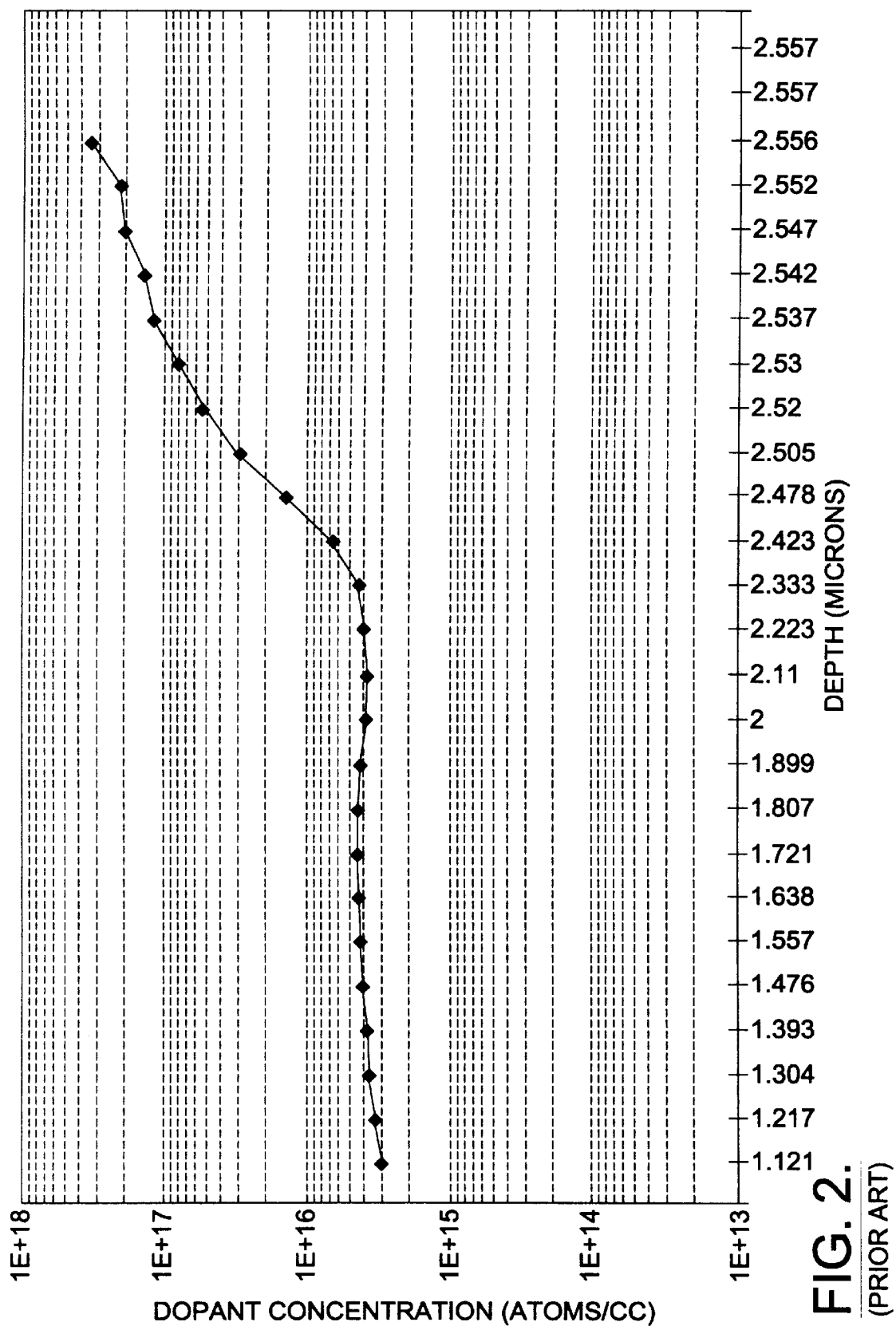
FIG. 2 is a chart diagram showing an unstable dopant concentration profile in the prior art apparatus and process of FIG. 1.
Figure 3:
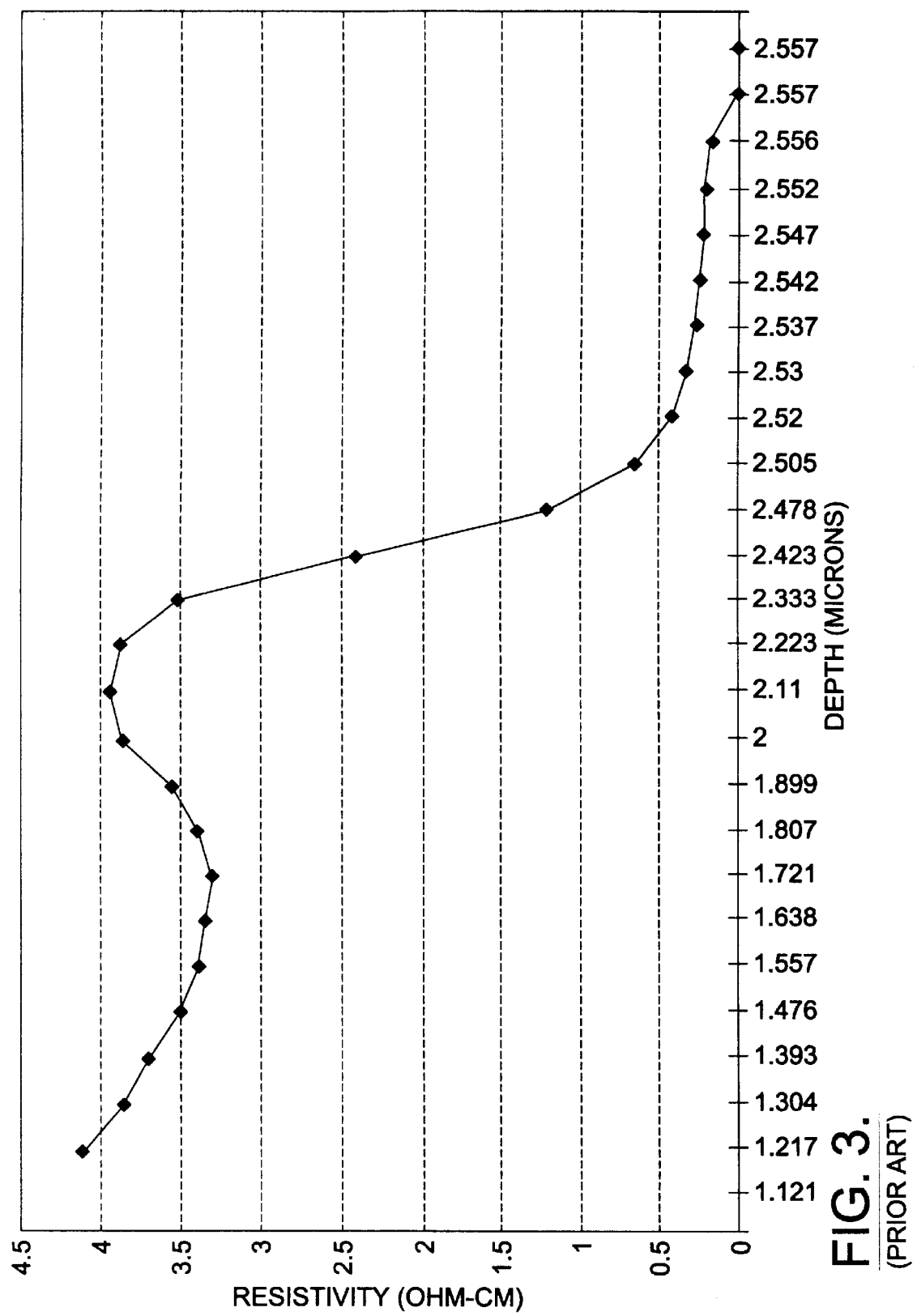
FIG. 3 is a chart diagram showing an unstable resistivity profile in the prior art apparatus and process of FIG. 1.

TABLE 1 shows test results obtained using an epitaxial reactor manufactured by Applied Materials Technology Corporation (AMT), which has an arrangement as described hereinabove and as depicted in FIG. 1. The dopant concentration and resistivity are measured at various depths, and the results are listed in TABLE 1, and are also plotted in FIGS. 2 and 3. FIG. 2 is a diagram of dopant concentration as a function of depth, showing an unstable and inconsistent dopant concentration profile. FIG. 3 is a diagram of resistivity as a function of depth, showing an unstable and inconsistent resistivity profile.

TABLE 1

Test Data with Autodoping

| Voltage (Volts) | Capacitance (Farads) | Depth (microns) | Dopant Conc. (atoms/cc) | Resistivity (ohm-cm) |
|---|---|---|---|---|
| 0 | 5.21E − 10 | | | |
| −1.491 | 3.04E − 10 | 1.121 | 3.12E + 15 | |
| −2.023 | 2.79E − 10 | 1.217 | 3.33E + 15 | 4.11 |
| −2.599 | 2.58E − 10 | 1.304 | 3.57E + 15 | 3.85 |
| −3.223 | 2.42E − 10 | 1.393 | 3.73E + 15 | 3.684 |

TABLE 1-continued

Test Data with Autodoping

| Voltage (Volts) | Capacitance (Farads) | Depth (microns) | Dopant Conc. (atoms/cc) | Resistivity (ohm-cm) |
|---|---|---|---|---|
| −3.899 | 2.28E − 10 | 1.476 | 3.96E + 15 | 3.484 |
| −4.631 | 2.15E − 10 | 1.557 | 4.09E + 15 | 3.379 |
| −5.424 | 2.05E − 10 | 1.638 | 4.14E + 15 | 3.338 |
| −6.283 | 1.95E − 10 | 1.721 | 4.21E + 15 | 3.289 |
| −7.214 | 1.85E − 10 | 1.807 | 4.09E + 15 | 3.376 |
| −8.221 | 1.76E − 10 | 1.899 | 3.91E + 15 | 3.527 |
| −9.313 | 1.68E − 10 | 2 | 3.58E + 15 | 3.835 |
| −10.469 | 1.59E − 10 | 2.11 | 3.50E + 15 | 3.919 |
| −11.777 | 1.51E − 10 | 2.223 | 3.57E + 15 | 3.845 |
| −13.165 | 1.43E − 10 | 2.333 | 3.95E + 15 | 3.494 |
| −14.668 | 1.37E − 10 | 2.423 | 5.97E + 15 | 2.362 |
| −16.296 | 1.33E − 10 | 2.478 | 1.28E + 16 | 1.176 |
| −18.06 | 1.31E − 10 | 2.505 | 2.71E + 16 | 0.612 |
| −19.971 | 1.30E − 10 | 2.52 | 4.82E + 16 | 0.387 |
| −22.04 | 1.29E − 10 | 2.53 | 7.17E + 16 | 0.289 |
| −24.282 | 1.29E − 10 | 2.537 | 1.05E + 17 | 0.222 |
| −26.71 | 1.29E − 10 | 2.542 | 1.17E + 17 | 0.207 |
| −29.34 | 1.28E − 10 | 2.547 | 1.66E + 17 | 0.167 |
| −32.19 | 1.28E − 10 | 2.552 | 1.71E + 17 | 0.165 |
| −35.276 | 1.28E − 10 | 2.556 | 2.83E + 17 | 0.125 |
| −38.619 | 1.28E − 10 | 2.557 | | 0 |
| −42.24 | 1.28E − 10 | 2.557 | | 0 |
| −46.163 | 1.28E − 10 | | | |

Therefore, one of the primary objectives of the present invention is to provide an apparatus and a process for growing a silicon epitaxial layer having a stable and a consistent dopant concentration and resistivity profile. This is achieved by correctly identifying the problem of the conventional arrangement as being caused by gas pressure fluctuation on both sides of the auxiliary MFC, and by providing a corrective measure to control the supply of the auxiliary dopant.

Figure 4:
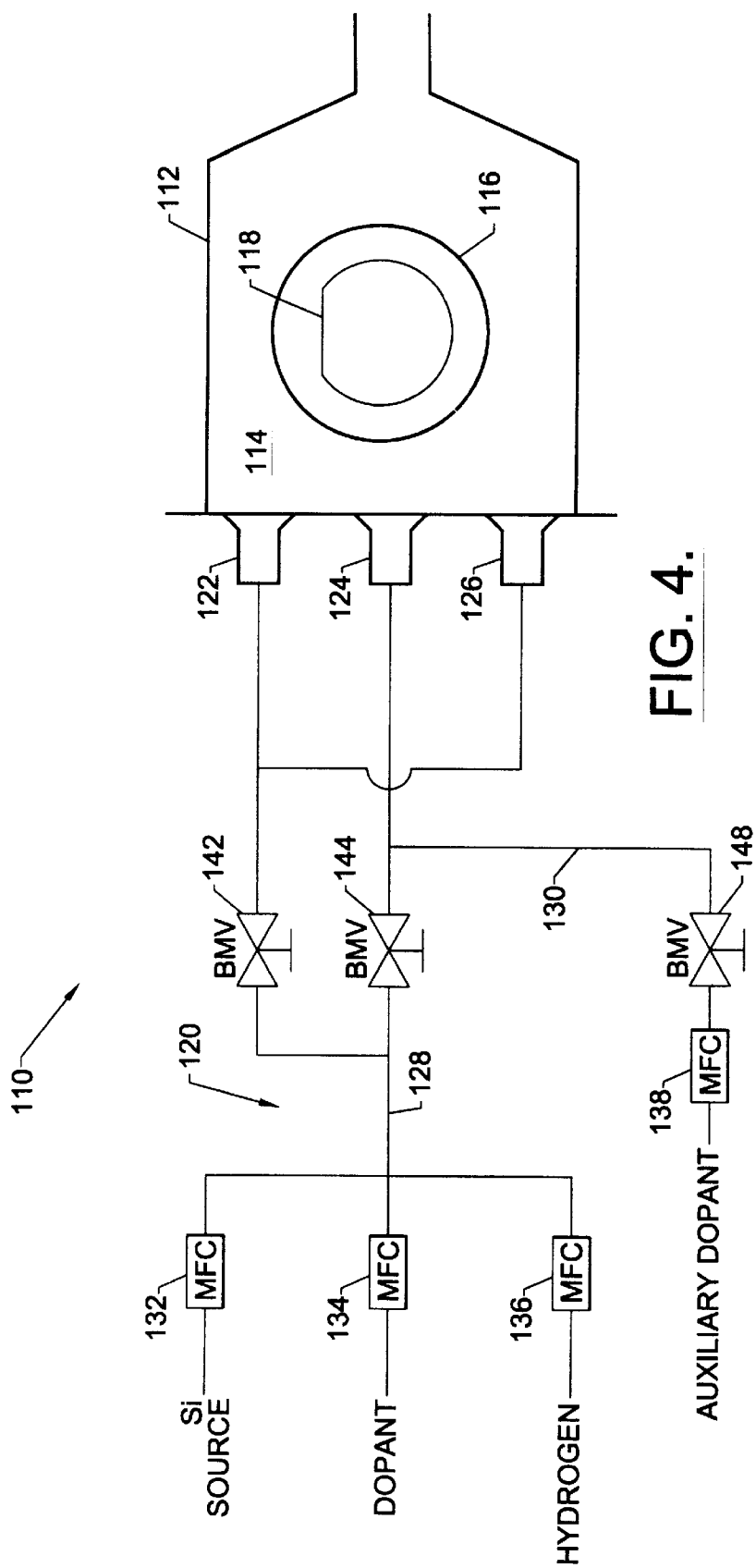
FIG. 4 is an illustrative diagram showing one of the preferred embodiments of the present invention's apparatus and process.

Referring to FIG. 4, there is shown one of the preferred embodiments of an apparatus and a process according to the present invention which utilizes a single-wafer-processing apparatus 110 for growing a gas phase silicon epitaxial wafer. The apparatus 110 has features in common with the conventional apparatus 10 described earlier, and therefore some of the common features are not described in detail hereafter.

The apparatus 110 in accordance with the present invention includes a reactor 112 and a gas feeder system 120. The reactor 112 has a reaction chamber 114, and a disc-shaped susceptor 116 is mounted within the reactor 112. The susceptor 116 holds a silicon substrate wafer 118 on the top surface thereof and is rotated in a horizontal plane during epitaxy.

The gas feeder system 120 is fluidly connected to the reaction chamber 114 of the reactor 112, and comprises three injectors 122, 124 and 126 arranged transversely to the longitudinal axis of the reactor 112. The three injectors 122, 124 and 126 have a common gas feed line 128 which is in turn connected to MFCs for the reactive gas. The reactive gas consists of the silicon source, a small volume of the dopant and hydrogen ($H_2$) for diluting the silicon source and the dopant.

The injectors 122, 124 and 126 concurrently feed flows of the reactive gas of an equal silicon source concentration and an equal dopant concentration to the main surface of the wafer 118 on the susceptor 116. MFCs 132, 134 and 136 control the silicon source concentration and the dopant concentration of the reactive gas fed to the three injectors. The gas feed line 128 is further connected to two bellows metering valves 142 and 144 respectively before being connected to the injectors 122 and 126, and 124 respectively. A typical mass flow controller used in the present invention is a 5964 metal sealed MFC obtained from Brookes Instrument. The size of such a MFC is about 300 SCCM. The MFC is calibrated in hydrogen. A typical bellows meter valve used in the present invention is a SS-4 BMK-5857 model obtained from Nupro. However, it should be understood that other types of MFCs or bellows meter valves may also be used as long as they perform the same functions and obtain the same results.

In addition, an auxiliary dopant supply line 130 is provided with an auxiliary dopant, deposited only into the central injector 124 that effects epitaxial deposition on the center of the wafer 118. An auxiliary MFC 138 is also provided to control the amount of the auxiliary dopant such that it will match the autodoping dopant on the peripheral edges of the wafer for giving a smooth resistivity profile.

To address the problem created by the gas pressure fluctuation on both sides of the auxiliary MFC, an auxiliary bellows metering valve 148 is provided between the auxiliary MFC 138 and the center injector 124. The main function of the bellows metering valve 148 is to absorb pressure variations in the central flow line to prevent the pressure variations from reaching the auxiliary MFC 138.

It is emphasized that while a bellows metering valve is utilized in this preferred embodiment of the present invention, it is well within the scope and spirit of the present invention to utilize any devices or means that has the same basic function and/or which achieves the same basic result of isolating or protecting the auxiliary MFC from the pressure variations in the central flow line. Examples of such devices include, but are not limited to, pressure control valve, pressure regulator, butterfly valve, fixed orifice valve, rotometer, and the like. These devices are commercially available.

The present invention has been found to provide a number of advantages. By providing means for absorbing the pressure variations in the central flow line, the pressure variations are prevented from reaching the auxiliary MFC, and therefore a consistent resistivity profile can be achieved on the epitaxial layer without a protective seal on the back surface of the wafer.

Figure 5:
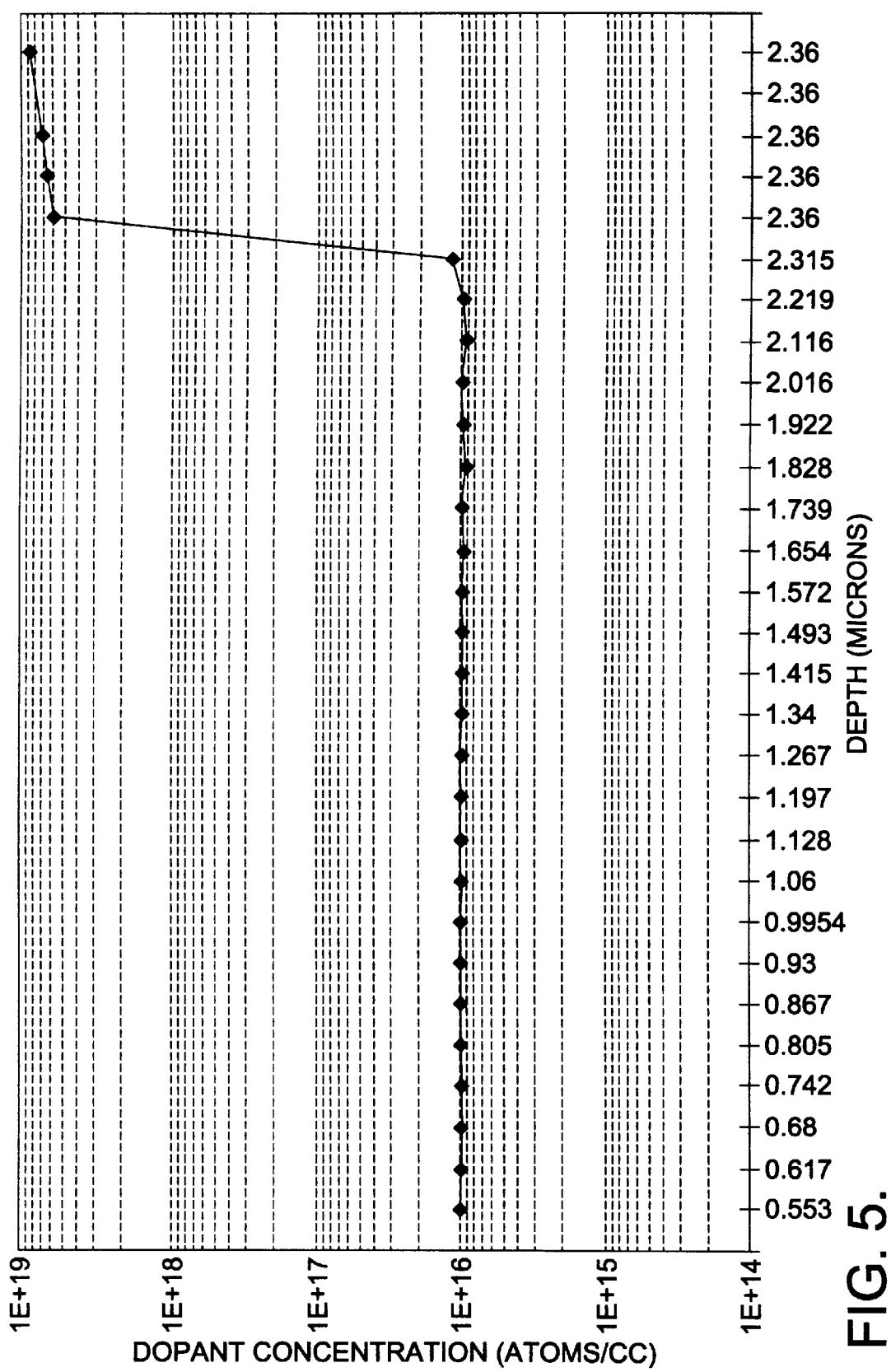
FIG. 5 is a chart diagram showing a stable and consistent dopant concentration profile obtained by utilizing the apparatus and process of FIG. 4.
Figure 6:
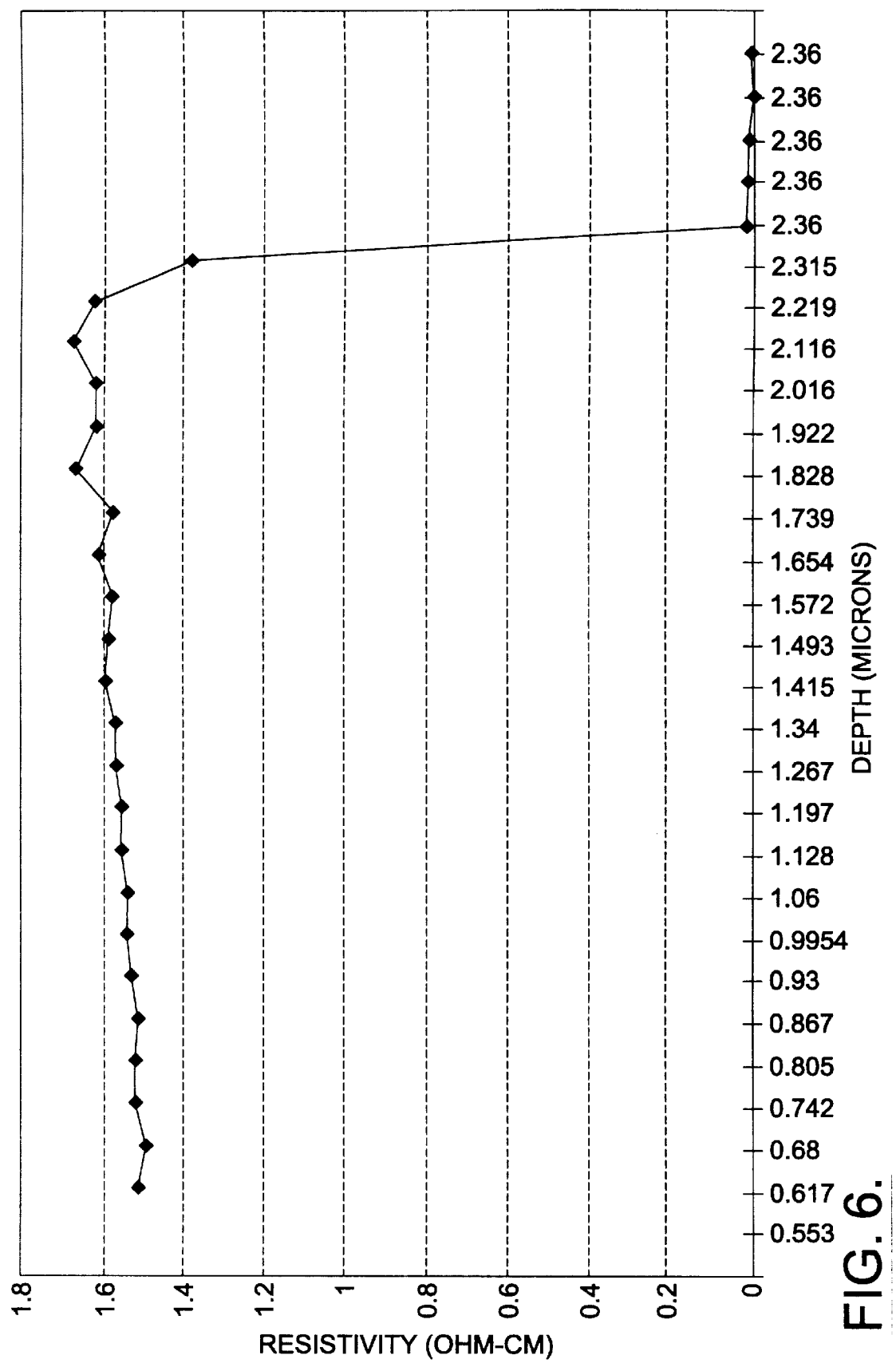
FIG. 6 is a chart diagram showing a stable and a consistent resistivity profile obtained by utilizing the apparatus and process of FIG. 4.

TABLE 2 shows test results obtained using an epitaxial reactor in accordance with the present invention which has an arrangement as described hereinabove and as depicted in FIG. 4. The dopant concentration and resistivity are measured at various depths, and the results are listed in TABLE 2, and also are plotted in FIGS. 5 and 6. FIG. 5 is a diagram of dopant concentration as a function of depth, showing a stable and consistent dopant concentration profile. FIG. 6 is a diagram of resistivity as a function of depth, showing a stable and consistent resistivity profile.

TABLE 2

Test Data with Autodoping Correction

| Voltage (Volts) | Capacitance (Farads) | Depth (microns) | Dopant Conc. (atoms/cc) | Resistivity (ohm-cm) |
|---|---|---|---|---|
| 0 | 1.16E − 09 | | | |
| −1.491 | 6.25E − 10 | 0.553 | 9.73E + 15 | |
| −2.023 | 5.57E − 10 | 0.617 | 9.551E + 15 | 1.513 |
| −2.599 | 5.02E − 10 | 0.68 | 9.64E + 15 | 1.494 |
| −3.223 | 4.59E − 10 | 0.742 | 9.48E + 15 | 1.518 |
| −3.899 | 4.22E − 10 | 0.805 | 9.47E + 15 | 1.518 |

TABLE 2-continued

Test Data with Autodoping Correction

| Voltage (Volts) | Capacitance (Farads) | Depth (microns) | Dopant Conc. (atoms/cc) | Resistivity (ohm-cm) |
|---|---|---|---|---|
| −4.631 | 3.91E − 10 | 0.867 | 9.50E + 15 | 1.513 |
| −5.424 | 3.63E − 10 | 0.93 | 9.38E + 15 | 1.533 |
| −6.283 | 3.39E − 10 | 0.995 | 9.31E + 15 | 1.543 |
| −7.214 | 3.18E − 10 | 1.06 | 9.33E + 15 | 1.541 |
| −8.221 | 2.99E − 10 | 1.128 | 9.22E + 15 | 1.557 |
| −9.313 | 2.81E − 10 | 1.197 | 9.20E + 15 | 1.56 |
| −10.496 | 2.65E − 10 | 1.267 | 9.14E + 15 | 1.57 |
| −11.777 | 2.51E − 10 | 1.34 | 9.12E + 15 | 1.573 |
| −13.165 | 2.37E − 10 | 1.415 | 8.99E + 15 | 1.594 |
| −14.668 | 2.25E − 10 | 1.493 | 9.02E + 15 | 1.589 |
| −16.296 | 2.13E − 10 | 1.572 | 9.08E + 15 | 1.58 |
| −18.06 | 2.03E − 10 | 1.654 | 8.85E + 15 | 1.617 |
| −19.971 | 1.93E − 10 | 1.739 | 9.06E + 15 | 1.582 |
| −22.04 | 1.83E − 10 | 1.828 | 8.54E + 15 | 1.672 |
| −24.282 | 1.74E − 10 | 1.922 | 8.82E + 15 | 1.624 |
| −26.71 | 1.66E − 10 | 2.016 | 8.79E + 15 | 1.628 |
| −29.34 | 1.58E − 10 | 2.116 | 8.49E + 15 | 1.682 |
| −32.19 | 1.51E − 10 | 2.219 | 8.79E + 15 | 1.629 |
| −35.276 | 1.44E − 10 | 2.315 | 1.06E + 16 | 1.394 |
| −38.619 | 1.39E − 10 | 2.36 | 5.85E + 18 | 0.013 |
| −42.24 | 1.39E − 10 | 2.36 | 6.33E + 18 | 0.013 |
| −46.163 | 1.39E − 10 | 2.36 | 6.86E + 18 | 0.012 |
| −50.412 | 1.39E − 10 | 2.36 | | 0 |
| −55.014 | 1.39E − 10 | 2.36 | 8.06E + 18 | 0.01 |
| −60 | 1.39E − 10 | | | |

Figure 7:
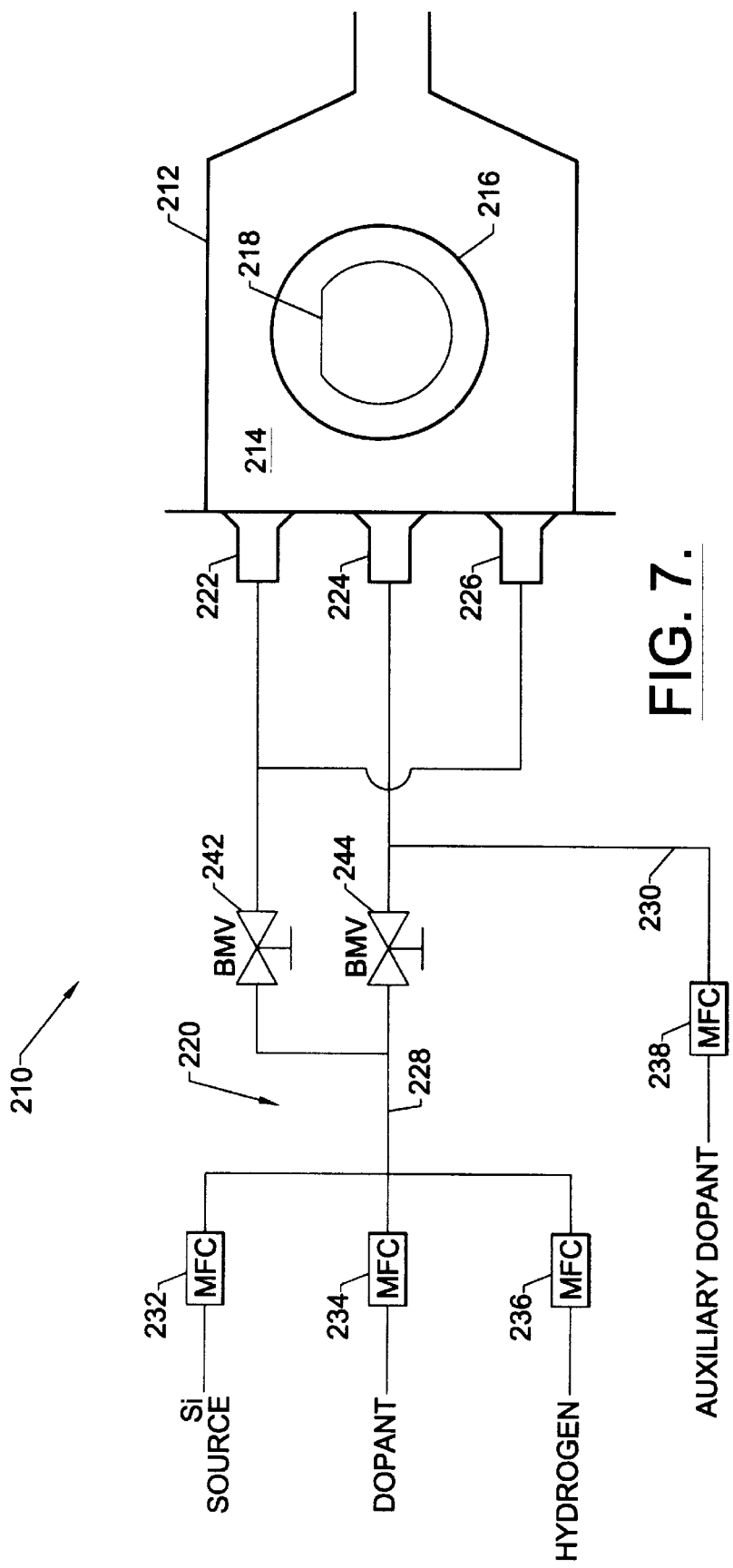
FIG. 7 is an illustrative diagram showing another one of the preferred embodiments of the present invention's apparatus and process.

Referring to FIG. 7, there is shown another one of the preferred embodiments of an apparatus and a process according to the present invention which utilizes a single-wafer-processing apparatus 210 for growing a gas phase silicon epitaxial wafer. The apparatus 210 is also very similar to the apparatus 110 according to the present invention which is described earlier, and therefore some of the common features are not described in detail hereinafter.

Briefly, the apparatus 210 in accordance with the present invention includes a reactor 212 and a gas feeder system 220. The reactor 212 has a reaction chamber 214, and a disc-shaped susceptor 216 is mounted within the reactor 212. The susceptor 216 holds a silicon substrate wafer 218 on the top surface thereof and is rotated in a horizontal plane during epitaxy.

The gas feeder system 220 is fluidly connected to the reaction chamber 214 of the reactor 212, and comprises three injectors 222, 224 and 226 arranged transversely to the longitudinal axis of the reactor 212. The three injectors 222, 224 and 226 have a common gas feed line 228 which is in turn connected to MFCs for the reactive gas. The reactive gas consists of the silicon source, a small volume of the dopant and hydrogen ($H_2$) for diluting the silicon source and the dopant.

The injectors 222, 224 and 226 concurrently feed flows of the reactive gas of an equal silicon source concentration and an equal dopant concentration to the main surface of the wafer 218 on the susceptor 216. MFCs 232, 234 and 236 control the silicon source concentration and the dopant concentration of the reactive gas fed to the three injectors. The gas feed line 228 is further connected to two bellows metering valves 242 and 244 respectively before being connected to the injectors 222 and 226, and 224 respectively.

In this alternative embodiment, instead of using a bellows metering valve between the auxiliary MFC and the center injector, an auxiliary dopant supply line 230 is connected to the central gas supply line before the bellows metering valve 244, which acts to absorb pressure variations in the central flow line to prevent such pressure variations from reaching an auxiliary MFC 238. Since the pressure variations are prevented from reaching the auxiliary MFC, a stable and consistent resistivity profile can be achieved on the epitaxial layer without a protective seal on the back surface of the wafer.

Another aspect of the present invention is directed to a process for growing a silicon epitaxial layer with a consistent dopant concentration and resistivity profile. The main steps of the method according to the present invention include concurrently feeding parallel flows of reactive gas comprising a silicon source, a dopant and hydrogen from a plurality of positions which are arranged in a width direction of the flows into the chamber so that an epitaxial layer is formed in the vicinity of the center of the silicon wafer and in the vicinity of the peripheral portions of the wafer, and adjusting the concentration of the dopant in the reactive gas which is fed from a center side in the width direction of the flows so that the resistivity of the epitaxial layer formed in the vicinity of the center of the silicon wafer is approximately the same as that of the vicinity of the peripheral portions thereof.

The adjusting step causes a consistent amount of auxiliary dopant to pass into the reactive gas which is fed from the center side by preventing pressure fluctuation from reaching the auxiliary MFC. Preferably, the critical step is carried out by utilizing a bellows metering valve provided between the center injector and the auxiliary MFC. Alternatively, it may be carried out by connecting the auxiliary dopant supply line to the central gas supply line before the existing central bellows metering valve.

The foregoing is meant to illustrate, but not to limit, the scope of the invention. Indeed, those of ordinary skill in the art can readily envision and produce further embodiments, based on the teachings herein, without undue experimentation.

The present invention may be embodied in other specific forms without departing from its essential characteristics. The described embodiment is to be considered in all respects only as illustrative and not as restrictive. The scope of the invention is, therefore, indicated by the appended claims rather than by the foregoing description. All changes which come within the meaning and range of the equivalents of the claims are to be embraced within their scope.

What is claimed is:

1. A process for growing a silicon epitaxial layer on a main surface of a silicon wafer which is held in a horizontal type of chamber, said silicon wafer having a center portion and peripheral portions, the process comprising the steps of:

concurrently feeding parallel flows of reactive gas from a plurality of positions which are arranged in a width direction of the flows into the chamber so that an epitaxial layer is formed in the vicinity of the center of the silicon wafer and in the vicinity of the peripheral portions of the wafer, the reactive gas comprising a silicon source, a dopant and hydrogen;

absorbing pressure variations in the flow of reactive gas toward the center of the silicon wafer; and adjusting the concentration of the dopant in the reactive gas which is fed toward the center portion of the silicon wafer so that the resistivity of the epitaxial layer formed in the vicinity of the center of the silicon wafer is approximately the same as that of the vicinity of the peripheral portions thereof.

2. The process of claim 1, wherein said adjusting step comprises:

a first adjusting step to provide a predetermined amount of auxiliary dopant to pass into the reactive gas which is fed from the center side; and a second adjusting step to reduce the concentration variation of the auxiliary dopant in the reactive gas.

3. The process of claim 2, wherein said first adjusting step is carried out by a mass flow controller.

4. The process of claim 2, wherein said second adjusting step is carried out by a valve.

5. The process of claim 4, wherein said valve is a bellows metering valve.

6. A process for growing a silicon epitaxial layer on a main surface of a silicon wafer which is held in a horizontal type of chamber, wherein said silicon wafer has a center portion and peripheral portions, the process comprising the steps of:

concurrently feeding parallel flows of reactive gas from a plurality of positions which are arranged in a width direction of the flows into the chamber so that an epitaxial layer is formed in the vicinity of the center of the silicon wafer and in the vicinity of the peripheral portions of the wafer, the reactive gas comprising a silicon source, a dopant and hydrogen;

feeding a predetermined amount of auxiliary dopant into flows of the reactive gas which is fed toward the center portion of the silicon wafer at a constant concentration so that the resistivity of the epitaxial layer formed in the vicinity of the center of the silicon wafer is approximately the same as that of the vicinity of the peripheral portions thereof; and absorbing pressure variations in the flow of reactive gas toward the center of the silicon wafer.

7. The process of claim 6, wherein said auxiliary dopant feeding step comprises the steps of:

providing the predetermined amount of auxiliary dopant through a mass flow controller; and passing the auxiliary dopant through a valve system so that the concentration of the auxiliary dopant in the reactive gas is constant.

8. The process of claim 7, wherein said valve is a bellows metering valve.

* * * * *